United States Patent
Gilfeather

(10) Patent No.: US 6,661,246 B1
(45) Date of Patent: Dec. 9, 2003

(54) CONSTANT-CURRENT $V_{DDQ}$ TESTING OF INTEGRATED CIRCUITS

(75) Inventor: Glen Patrick Gilfeather, Del Valle, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/694,523

(22) Filed: Oct. 23, 2000

(51) Int. Cl.[7] .............................................. G01R 31/26
(52) U.S. Cl. ..................... 324/763; 324/765; 324/158.1
(58) Field of Search .............................. 324/158.1, 73.1, 324/763, 765; 714/733, 736; 702/119

(56) References Cited

U.S. PATENT DOCUMENTS

| | | | | |
|---|---|---|---|---|
| 5,481,551 A | * | 1/1996 | Nakano et al. | 324/73.1 |
| 5,731,700 A | * | 3/1998 | McDonald | 324/765 |
| 5,949,798 A | * | 9/1999 | Sakaguchi | 371/27.1 |
| 6,118,293 A | * | 9/2000 | Manhaeve et al. | 324/765 |
| 6,246,248 B1 | * | 6/2001 | Yamagishi | 324/763 |

* cited by examiner

*Primary Examiner*—Vinh P. Nguyen

(57) ABSTRACT

Integrated circuit analysis is enhanced via a method and system for detecting defects associated with particular logic states of an integrated circuit. According to an example embodiment of the present invention, a constant current supply is applied to an integrated circuit. The voltage across the constant current supply is detected for each of a plurality of clock cycles of the integrated circuit, each clock cycle being representative of a logic state of the integrated circuit. The voltage detected at each clock cycle is compared, and the comparison is used to analyze the integrated circuit for a defect.

29 Claims, 2 Drawing Sheets

CONSTANT-CURRENT $V_{DDQ}$ TESTING OF INTEGRATED CIRCUITS

FIELD OF THE INVENTION

The present invention relates generally to semiconductor devices and their fabrication and, more particularly, to semiconductor devices and their manufacture involving techniques for analyzing and debugging circuitry within an integrated circuit.

BACKGROUND OF THE INVENTION

The semiconductor industry has recently experienced technological advances that have permitted dramatic increases in circuit density and complexity, and equally dramatic decreases in power consumption and package sizes. Present semiconductor technology now permits single-chip microprocessors with many millions of transistors, operating at speeds of hundreds of millions of instructions per second to be packaged in relatively small, air-cooled semiconductor device packages. A by-product of such high-density and high functionality in semiconductor devices has been an increase in difficulty of the processes used for manufacturing the devices.

As the manufacturing processes for semiconductor devices and integrated circuits increase in difficulty, methods for testing and debugging these devices become increasingly important. Not only is it important to ensure that individual circuits are functional, it is also important to ensure that batches of circuits perform consistently. In addition, the ability to detect a defective manufacturing process early is helpful for reducing the number of defective devices manufactured.

Several testing techniques have been developed for integrated circuits for detecting failure modes such as gate-oxide shorts, bridging defects, parasitic transistor leakage, defective p-n junctions, and transistors with incorrect threshold voltages. Such faults may pass functional and logical testing, but can malfunction over time, causing reliability problems. Many of those faults cause elevated quiescent power supply current ($I_{ddq}$), which is typically several orders of magnitude greater than the $I_{ddq}$ of a fault-free device. For example, in static random-access memories (SRAMs), most of the $I_{ddq}$ testable faults are activated during the write/read cycles. By monitoring an output current level, $I_{ddq}$ testing has been shown as an effective way for testing integrated circuits such as CMOS combinational circuits, and can also be effective for detecting SRAM defects that escape traditional voltage monitoring techniques. In typical $I_{ddq}$ testing, the device under test (DUT) has a constant voltage power supply and the current is monitored for changes. These changes are used to analyze the DUT. One problem associated with $I_{ddq}$ testing is the difficulty of measuring the $I_{ddq}$ current. In particular, obtaining an accurate current measurement from a DUT exhibiting high current can be difficult, inefficient, and produce inaccurate results.

SUMMARY OF THE INVENTION

The present invention is directed to integrated circuit analysis, and is exemplified in a number of implementations and applications, some of which are summarized below.

According to an example embodiment of the present invention, an integrated circuit device (DUT) is analyzed using a constant current source and a voltage detection device. The current source is electrically coupled to the DUT and the voltage is monitored while the current supply is held constant. Detected variations in voltage between test vectors at different clock cycles are used for evaluating the potential for a defect at the particular logic state associated with the clock cycle exhibiting a variation. By using a constant current source and monitoring the voltage, the difficulties associated with current measurement addressed hereinabove can be avoided. In this manner, the logic states having a defect can be isolated for additional testing, improving failure analysis of the DUT.

The above summary of the present invention is not intended to describe each illustrated embodiment or every implementation of the present invention. The figures and detailed description that follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
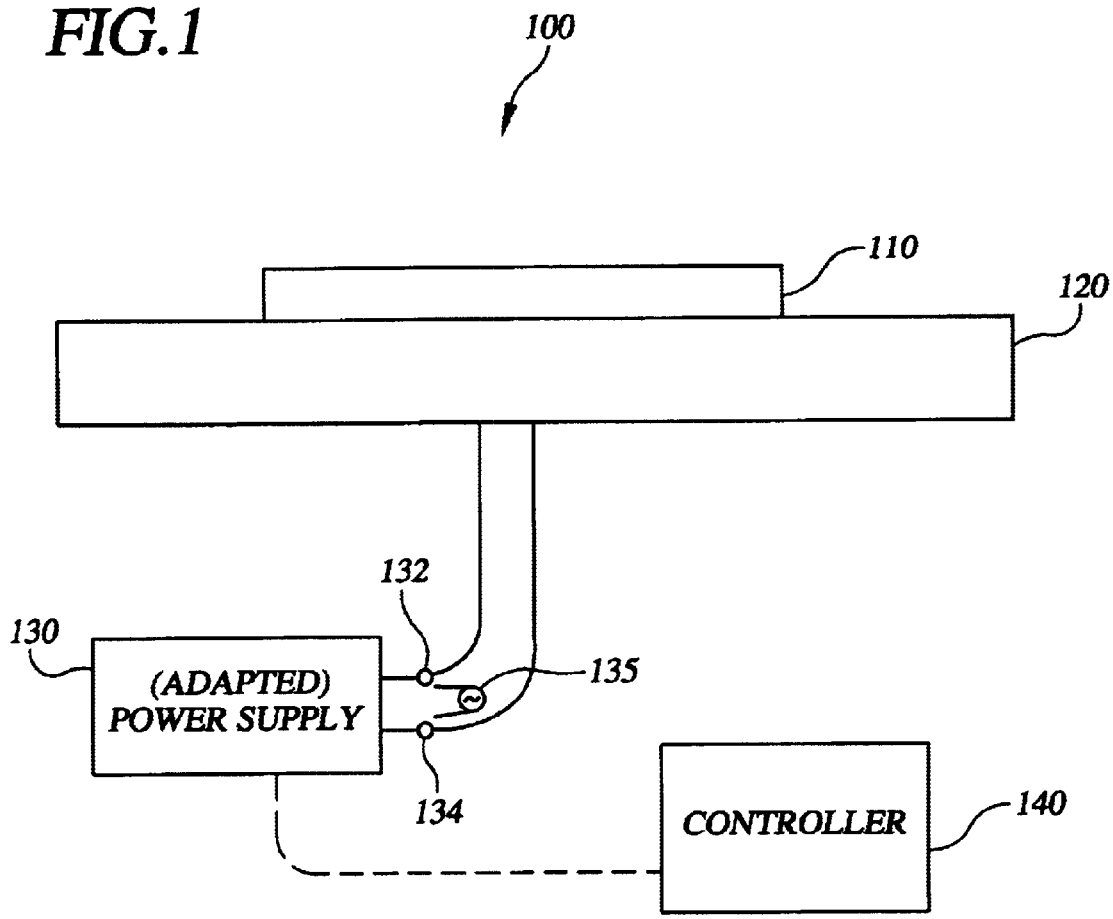
FIG. 1 is a system for analyzing an integrated circuit, according to an example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable for a variety of different types of semiconductor devices, and the invention has been found to be particularly suited for integrated circuits that draw high current and require or benefit from analysis involving defect detection at various logic states. While the present invention is not necessarily limited to such devices, various aspects of the invention may be appreciated through a discussion of various examples using this context.

According to an example embodiment of the present invention, an integrated circuit device under test (DUT) is analyzed for defects under various DUT logic states. It has been discovered that, by coupling a constant current source to the DUT while monitoring the $V_{ddq}$ voltage across the current source for various DUT clock cycles, variations in the monitored $V_{ddq}$ between clock cycles can be used as an indication of a potential defect affecting the circuit. These variations can be used to discover and isolate defects in the circuit. Once the defects have been discovered, other failure analysis methods can also be used to perform further tests. This provides an efficient manner in which to detect, isolate, and analyze integrated circuit defects.

According to a more particular example embodiment of the present invention, FIG. 1 shows a system 100 adapted to analyze an integrated circuit. The system may be a dedicated system for analyzing the die using the analysis methods described herein, or may be part of another conventional failure analysis system, such as a light-induced voltage alteration (LIVA) or thermal-induced voltage alteration (TIVA) system. A die 110 is placed in a die holder 120, and a power supply 130 is coupled to the die through the die holder. The voltage across leads 132 and 134 can be monitored (e.g., using conventional voltage measurement equipment 135) and used for analyzing the die. In one implementation, the power supply 130 is adapted to first supply a constant voltage, and the current is measured for a known logic state. Once the current is measured, the power supply is switched to a constant current mode, and is used to supply the measured current to the die. In another implementation, the power supply is specially adapted to input selected signals to the die, such as to simulate normal operation, to simulate an operational loop that induces a failure, and to cycle the die through clock cycles.

The system 100 optionally includes a controller 140 adapted to control the power supply 130. In one implementation, the controller includes a computer having a memory adapted to store information, such as the signals supplied to the die or test data obtained in response to the signals. Test data, such as voltage data across the leads 132 and 134, can be stored in memory along with data representing the signals provided to the die. The stored data can then be used to analyze the die. One example representation of stored voltage data is shown in FIG. 2.

Figure 2:
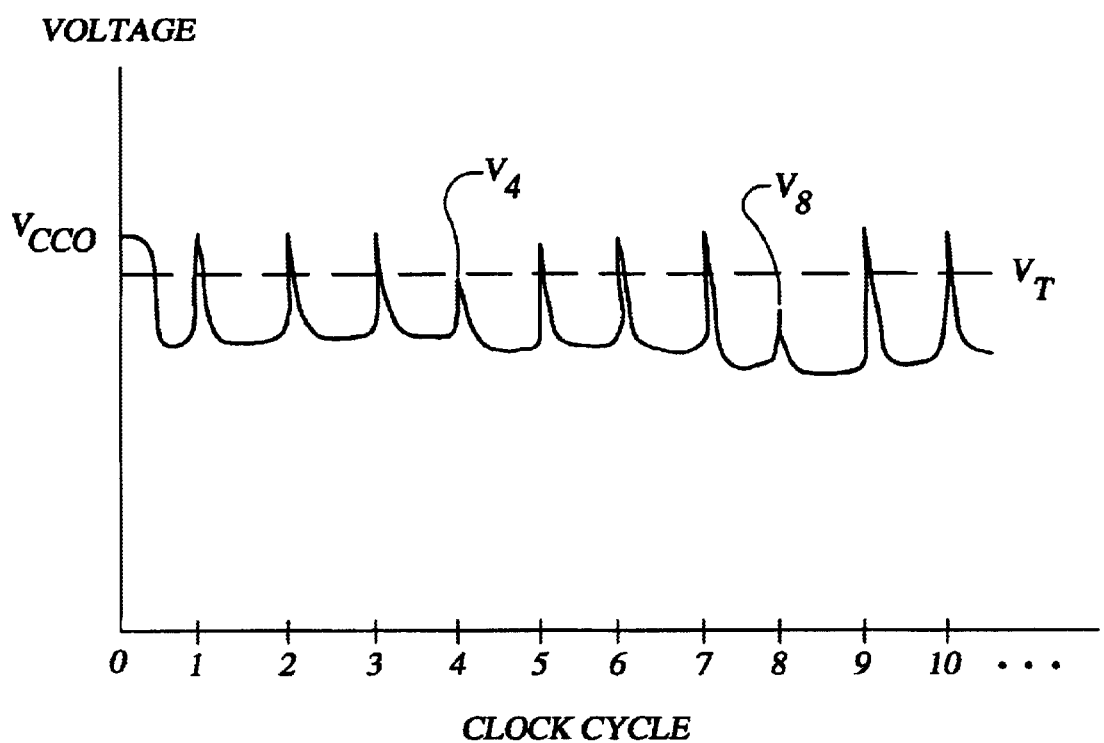
FIG. 2 is a graph of voltage versus clock cycle, according to another example embodiment of the present invention.

FIG. 2 is a graph of voltage versus clock cycle for a DUT, according to another example embodiment of the present invention. Ten clock cycles are shown, and voltage is plotted for each clock cycle. The graph is generated by first powering the device under test (DUT) and clocking it out of reset and into a known logic state. The clock and any signals being applied to the die are stopped, and a reference current being supplied to the die is measured. A power source having a constant current supply is then connected to the die with the current being set at the level of the reference current, and a reference voltage ($V_{CC0}$) is obtained across the leads of the power supply. The die is then clocked (advanced one clock cycle) several times, and voltage measurements across the power supply are obtained for each clock cycle.

As circuitry in the die is operated (e.g., transistors switched), the voltage drops when power is drawn during a particular clock cycle. After the circuit operation takes place, the voltage returns to a level near $V_{CC0}$. In instances where there is a defect, such as in a circuit exhibiting leakage, the voltage doesn't necessarily return to a level that is as high as it would have been, absent the defect. Clock cycles having a voltage delta (difference from a reference voltage) that is significant represent clock cycles for which further analysis may be useful. For example, the graph shows voltage peaks (i.e., as spikes or mesas) at clock cycles 4 and 8, wherein the voltage is below a threshold amount ($V_T$) less than $V_{CC0}$. The threshold amount is selected as a function of the particular die being tested and/or other operating conditions of the die. In one implementation, the threshold amount is in a range of between about 10 millivolts and 100 millivolts less than the reference voltage. Once clock cycles having a potential defect are identified, such as cycles 4 and 8 in FIG. 2, further analysis is performed on the die.

One cause of a voltage not reaching the threshold amount is the existence of excess current in the die. Excess current often results while the die is in a logic state in which an internal defect is affecting the circuit. By identifying the logic states that are affected, the defect source can be tracked down and tested further. For instance, the die can be clocked into the particular logic state exhibiting a below-threshold voltage peak and analyzed using other failure analysis techniques, such as LIVA or emission microscopy. This enables fault isolation that helps to speed the analysis process of integrated circuit dies.

The detected voltage can also be used in other manners for isolating a defect. For example, as an alternative to comparing the voltage at each clock cycle to $V_{CC0}$, comparisons may be made from cycle to cycle. Any significant change in the voltage is noted and used for further analysis. In addition, a voltage threshold (shown as $V_T$ in FIG. 2) may be defined as a particular voltage level below the reference voltage that is sufficiently low to indicate the presence of a defect. When the voltage detected at a particular clock cycle does not reach $V_T$, it is noted and used for further analysis. This is particularly useful in a testing arrangement, such as shown in FIG. 1, wherein the controller further includes a comparator. The comparator is adapted to generate a signal when the detected voltage does not reach $V_T$ and, in response, the controller notes the clock cycle at which the voltage was detected. In another implementation, the threshold voltage is defined as a particular voltage level below a voltage level detected at a previous clock cycle.

In still another example embodiment of the present invention, a non-defective die having the same design as the defective die being analyzed is first used to determine the reference voltage $V_{CC0}$ in a manner not inconsistent with the die analysis described herein. The non-defective die may also be used to determine voltages at each clock cycle and to generate a non-defective voltage plot. A reference voltage curve is obtained from the non-defective die. The defective die is then clocked as described herein and a test voltage curve is obtained and overlaid on the reference voltage curve. Voltage levels in the reference curve that are below those in the test curve represent logic states being affected by a defect in the circuit.

In another example embodiment of the present invention, a plurality of test vectors (e.g., patterns) are run on a die, and the supply voltage is monitored for all threshold voltages and potentially several vectors having lower thresholds are detected. Voltages not reaching a threshold voltage for a particular clock cycle represent a potential defect for a particular test vector. Vectors resulting in a detected defect are noted and used to identify potential defective circuit paths or elements. This is particularly useful for narrowing the number of potential defect sites and isolating selected circuitry for additional analysis. For example, when a large number (e.g., 10,000) test vectors are run on a die, defects may be observed on a selected number (e.g., 250) of test vectors. By identifying these selected test vectors, the source of the defect is narrowed to include a circuit path or element being operated during the selected vectors for which a defect is observed. In this manner, other circuit elements or paths that do not exhibit a defect when operated can be eliminated as a potential defect source, improving the ability to isolate defects.

While the present invention has been described with reference to several particular example embodiments, those skilled in the art will recognize that many changes may be made thereto without departing from the spirit and scope of the present invention, which is set forth in the following claims.

What is claimed is:

1. A method for analyzing an integrated circuit, the method comprising:

applying a constant current supply to the integrated circuit;

detecting a voltage across the constant current supply for each of a plurality of clock cycles of the integrated circuit, each clock cycle being representative of a logic state of the integrated circuit; and detecting a defect in the device as a detected voltage at a clock cycle that is sufficiently different than a detected voltage at a different clock cycle.

2. The method of claim 1, wherein applying a constant current supply to the integrated circuit comprises:

applying a power supply to the integrated circuit;

clocking the integrated circuit until the circuit is in a known state;

terminating the clock and any test signals being supplied to the integrated circuit;

measuring the current level being supplied to the integrated circuit by the power supply; and replacing the power supply with a constant current source and applying current to the integrated circuit at the measured current level.

3. The method of claim 1, wherein detecting a voltage across the constant current supply for each of a plurality of clock cycles of the integrated circuit comprises:

detecting the voltage across the constant current supply for a first clock cycle; and clocking the system clock once for each subsequent clock cycle to be analyzed and detecting the voltage across the constant current supply for each clock cycle.

4. The method of claim 1, wherein detecting a defect in the device as a detected voltage at a clock cycle that is sufficiently different than a detected voltage at a different clock cycle includes comparing the voltage of a clock cycle to a reference voltage defined as a voltage measured at a known logic state of the integrated circuit.

5. The method of claim 1, wherein detecting a defect in the device as a detected voltage at a clock cycle that is sufficiently different than a detected voltage at a different clock cycle includes comparing the detected voltage of subsequent or previous clock cycles.

6. The method of claim 1, wherein detecting a defect in the device as a detected voltage at a clock cycle that is sufficiently different than a detected voltage at a different clock cycle includes plotting the voltages on a graph and examining the graph for variations between the detected voltages.

7. The method of claim 6, wherein examining the graph for variations between the measured voltages includes detecting a peak in the graph that is lower than other peaks in the graph.

8. The method of claim 7, further comprising determining if the voltage peak fails to reach a threshold limit defined as a function of the integrated circuit and the current supply.

9. The method of claim 8, wherein the threshold limit is defined as a threshold voltage level less than a reference voltage level defined as a voltage level measured at a known logic state of the integrated circuit.

10. The method of claim 8, wherein the threshold limit is defined as a threshold voltage level less than the voltage level measured at a previous clock cycle.

11. The method of claim 1, further comprising arranging the integrated circuit in a test arrangement, wherein the test arrangement is adapted to apply the constant current and detect the voltage across the constant current supply.

12. The method of claim 1, wherein detecting a defect in the device as a detected voltage at a clock cycle that is sufficiently different than a detected voltage at a different clock cycle includes determining a logic state at which a defect is present.

13. The method of claim 12, wherein determining a logic state at which a defect is present includes using the variation in the voltages at different clock cycles, the voltage variation being indicative of excess current at a cycle exhibiting lower voltage than another cycle.

14. The method of claim 12, wherein determining a logic state at which a defect is present includes determining a plurality of logic states at which a defect is present, further comprising performing additional fault-analysis for each clock cycle associated with each logic state affected by a defect.

15. The method of claim 1, wherein detecting a defect in the device as a detected voltage at a clock cycle that is sufficiently different than a detected voltage at a different clock cycle includes isolating the defect in the circuit.

16. The method of claim 15, wherein detecting a defect in the device as a detected voltage at a clock cycle that is sufficiently different than a detected voltage at a different clock cycle further comprises using the isolated defect to perform additional analysis of the integrated circuit.

17. The method of claim 1, further including running a plurality of test vectors on the integrated circuit, and wherein detecting a defect comprises identifying a selected number of the test vectors that generate a defect during their application to the integrated circuit and using the selected number of test vectors to narrow the number of potential defect sites in the integrated circuit.

18. The method of claim 17, wherein using the selected number of test vectors to identify potential defects in the integrated circuit includes identifying target circuitry in the integrated circuit that is operating during the application of all of the defect-generating test vectors.

19. The method of claim 18, further including using another failure analysis technique to particularly identify a defect site that is part of the target circuitry.

20. A method for analyzing an integrated circuit, the method comprising:

applying a constant current supply having a selected current level to a non-defective integrated circuit;

detecting a reference voltage across the constant current supply for a known state of the non-defective circuit;

applying a constant current supply at the selected current level to a defective integrated circuit;

detecting a test voltage across the constant current supply at the defective integrated circuit for at least one clock cycle of the defective integrated circuit; and comparing the test voltage to the reference voltage and detecting a defect at the defective integrated circuit as a variation between the test voltage and the reference voltage.

21. The method of claim 20, wherein detecting a reference voltage across the constant current supply for a known state of the non-defective circuit includes detecting a reference voltage for a plurality of clock cycles, and wherein comparing the test voltage to the reference voltage and detecting a defect at the defective integrated circuit as a variation between the test voltage and the reference voltage includes graphing the reference voltages for the plurality of clock cycles and comparing the test voltage to the reference voltage graph.

22. The method of claim 21, wherein comparing the test voltage to the reference voltage and detecting a defect at the defective integrated circuit as a variation between the test voltage and the reference voltage further includes graphing the detected test voltage and comparing the test voltage graph to the reference voltage graph.

23. The method of claim 20, wherein applying a constant current supply having a selected current level to a non-defective integrated circuit comprises:

clocking the non-defective integrated circuit until it is in a known state;

applying a power supply to the non-defective integrated circuit at the known state;

measuring the current supplied by the power supply;

using the measured current as the selected current and applying the selected current to the non-defective integrated circuit using the constant current supply.

24. A system for analyzing an integrated circuit, the system comprising:

means for applying a constant current supply to the integrated circuit;

means for detecting a voltage across the constant current supply for each of a plurality of clock cycles of the integrated circuit, each clock cycle being representative of a logic state of the integrated circuit;

means for detecting a defect in the device as a detected voltage at a clock cycle that is sufficiently different than a detected voltage at a different clock cycle.

25. A system adapted to analyze an integrated circuit, the system comprising:

a power supply adapted to apply a constant current supply to the integrated circuit;

a voltage detector adapted to detect a voltage across the power supply for each of a plurality of clock cycles of the integrated circuit, each clock cycle being representative of a logic state of the integrated circuit;

a comparator adapted to compare the voltage detected at each clock cycle; and an evaluation arrangement adapted to use the voltage comparison for analyzing the integrated circuit for a defect.

26. The system of claim 25, wherein the system is further adapted to perform TIVA and LIVA analysis.

27. The system of claim 25, wherein the evaluation arrangement includes a computer arrangement coupled to the comparator.

28. The system of claim 27, wherein the computer arrangement is adapted to plot the voltage detected at each clock cycle on a graph.

29. The system of claim 27, wherein the computer arrangement is further adapted to store a reference voltage and compare the reference voltage with the detected voltage across the power supply for one of the plurality of logic states.

* * * * *